United States Patent [19]
Williams

[11] Patent Number: 5,841,324
[45] Date of Patent: Nov. 24, 1998

[54] CHARGE-BASED FREQUENCY LOCKED LOOP AND METHOD

[75] Inventor: Brian Eric Williams, W. Melbourne, Fla.

[73] Assignee: Harris Corporation, Melbourne, Fla.

[21] Appl. No.: 671,781

[22] Filed: Jun. 20, 1996

[51] Int. Cl.⁶ .................................................. H03L 7/099
[52] U.S. Cl. ................ 331/17; 331/14; 331/27; 331/34; 331/36 R; 331/36 C
[58] Field of Search .................................. 331/14, 17, 27, 331/34, 36 R, 36 C

[56] References Cited

U.S. PATENT DOCUMENTS

| | | | |
|---|---|---|---|
| 4,849,663 | 7/1989 | Kunze et al. | 307/521 |
| 4,987,373 | 1/1991 | Soo | 328/155 |
| 5,124,593 | 6/1992 | Michel . | |
| 5,239,455 | 8/1993 | Fobbester et al. . | |
| 5,384,554 | 1/1995 | Abernethy . | |
| 5,408,174 | 4/1995 | Leonowich . | |

*Primary Examiner*—Timothy P. Callahan
*Assistant Examiner*—An T. Luu
*Attorney, Agent, or Firm*—Rogers & Killeen

[57] ABSTRACT

A frequency locked loop (FLL) having an oscillator whose output frequency controls the amount of charge provided by a switched feedback capacitor to a charge integrator whose output voltage controls the frequency of the oscillator. A switched reference capacitor provides a charge to the charge integrator which is a function of a reference frequency, so that the oscillator output frequency is a function of a product of the reference frequency times a ratio of the capacitance of the reference capacitor to the capacitance of the feedback capacitor. Plural reference capacitors, each responsive to a respective reference frequency may be provided so that the oscillator output frequency can be related to the sums or differences of the reference frequencies, the ratios of capacitors, the ratio of the reference voltages or a fixed multiplication factor.

26 Claims, 2 Drawing Sheets

CHARGE-BASED FREQUENCY LOCKED LOOP AND METHOD

BACKGROUND OF THE INVENTION

The present invention is related to frequency locked loops and more specifically to a frequency locked loop and method which is based on switched-capacitor charge movement.

Frequency locked loops (FLL) are described in "Designing Tracking Error-Free Varactor Tuners With Frequency Locked Loop Integrated Circuits", C. W. Malinowski and H. Rinderle, *IEEE Transactions on Consumer Electronics*, Vol. CE-26, February, 1980. FLLs are alternatives to phase locked loops which require less integrated circuit real estate, improve locking range, ease difficulties in obtaining fractional frequency multiplications, and reduce phase jitter and side locking.

The present invention improves on the prior art FLLs by using a switched-capacitor circuit with a simple topology and which comprises components whose values can be well controlled. As is known, a switched-capacitor circuit is a frequency-to-current converter. A capacitor holds a charge q in coulombs which is the product of its capacitance C and the voltage V. A switched capacitor operating at frequency $f$ moves a charge of $f \cdot q$ coulombs per second, which is a current of $f \cdot C \cdot V$ amperes.

Accordingly, it is an object of the present invention to provide a novel charge-based FLL and method which obviates the problems of the prior art.

It is another object of the present invention to provide a novel FLL and method in which a feedback capacitor is switched at an oscillator output frequency to provide a current correction to the oscillator to control the frequency of the loop.

It is yet another object of the present invention to provide a novel method and charge-based FLL with an oscillator whose output frequency controls the amount of charge provided by a switched feedback capacitor to a charge integrator whose output voltage controls the frequency of the oscillator.

It is still another object of the present invention to provide a novel method and FLL with a switched-capacitor circuit for providing an input current to an integrating amplifier which is a function of a combination of a reference current related to a reference frequency and a feedback current related to an output frequency of an oscillator.

It is a further object of the present invention to provide a novel method and FLL with a switched-capacitor circuit for providing an input current to an integrating amplifier which controls a voltage controlled oscillator, in which plural reference capacitors each move a charge responsive to their respective reference frequencies so that the oscillator output frequency can be related to the sums or differences of the reference frequencies, the ratios of capacitors, the ratio of the reference voltages and/or a fixed multiplication factor.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
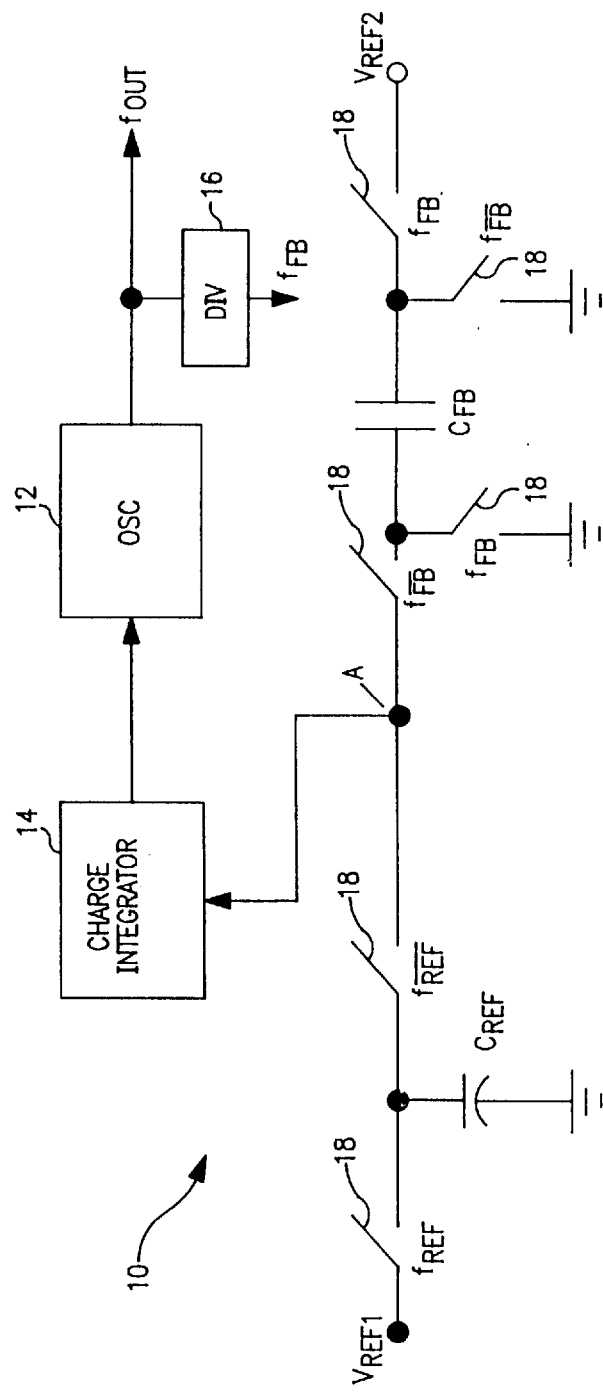
FIG. 1 is a combination block and circuit diagram of an embodiment of the present invention.

With reference now to FIG. 1, an embodiment 10 of the charge-based FLL of the present invention may include an oscillator 12 whose output frequency $f_{OUT}$ controls the amount of charge provided by a switched feedback capacitor $C_{FB}$ to a charge integrator 14 whose output voltage controls $f_{OUT}$. A divider 16 may be provided to divide $f_{OUT}$ by a factor N so that feedback frequency $f_{FB} = f_{OUT}/N$. Switched feedback capacitor $C_{FB}$ operates at frequency $f_{FB}$ and moves a charge of $f_{FB} \cdot q$ coulombs per second, which is an effective DC current of $f_{FB} \cdot C_{FB} \cdot R_{REF2}$ amperes. Switches 18 for operating the switched capacitors may be responsive to the frequency indicated by the switch designation, where a bar indicates an opposite phase to that of no bar.

FLL 10 may also include a switched reference capacitor $C_{REF}$ for providing a charge to charge integrator 14 which is a function of a reference frequency $f_{REF}$, so that oscillator 12 output frequency $f_{OUT}$ is a function of a product of reference frequency $f_{REF}$ times a ratio of the capacitance of reference capacitor $C_{REF}$ to the capacitance of feedback capacitor $C_{FB}$. Switched reference capacitor $C_{REF}$ operates at frequency $f_{REF}$ and moves a charge of $f_{REF} \cdot q$ coulombs per second, which is an effective DC current of $f_{REF} \cdot C_{REF} \cdot V_{REF1}$ amperes.

In operation, a charge is moved from $V_{REF1}$ by switched capacitor $C_{REF}$ to node A and thus to integrator 14. The voltage output of integrator 14 moves in the negative direction in response to the added charge. If oscillator 12 has a negative gain, $f_{OUT}$ will increase. This increase causes feedback capacitor $C_{FB}$ to remove charge from node A.

At a steady state condition, FLL 10 forces the currents provided by $C_{REF}$ and $C_{FB}$ to be equal (i.e., the direct current at node A is zero), and therefor:

$$f_{REF} \cdot C_{REF} \cdot V_{REF1} = f_{FB} \cdot C_{FB} \cdot V_{REF2} \qquad (1)$$

Since $f_{FB} = f_{OUT}/N$, equation 1 may be rewritten:

$$f_{OUT} = N \cdot f_{REF} \cdot (C_{REF}/C_{FB}) \cdot (V_{REF1}/V_{REF2}) \qquad (2)$$

As is apparent, oscillator 12 output frequency $f_{OUT}$ may be a function of reference frequency $f_{REF}$, the ratio of the capacitances of the two switched capacitors $C_{REF}$ and $C_{FB}$, the ratio of the reference voltages $V_{REF1}$ and $R_{REF2}$, and/or the factor from divider 16. The ratio of the reference voltages may be 1 (one) if the reference voltages are the same as would likely be normal, or may be set to offset or correct the ratio of the capacitances of the two switched capacitors.

In a preferred embodiment, FLL 10 is a single integrated circuit in which oscillator 12 is a voltage controlled oscillator (VCO) and charge integrator 14 is comprised of an accumulating capacitor and a high gain amplifier which provides the voltage for controlling the VCO. Switches 18 for operating the switched capacitors may be conventional integrated circuit switches suitable for the particular application, such as bipolar or field effect transistors. Switches 18 may also be discrete components which are switches of any type, albeit without the advantage of reduced real estate afforded by integrated circuit switches. The frequency divider factor N may be any number suitable for the particular application, including a number equal to or greater than one, or a fraction less than one (which implies a frequency multiplication).

Figure 2:
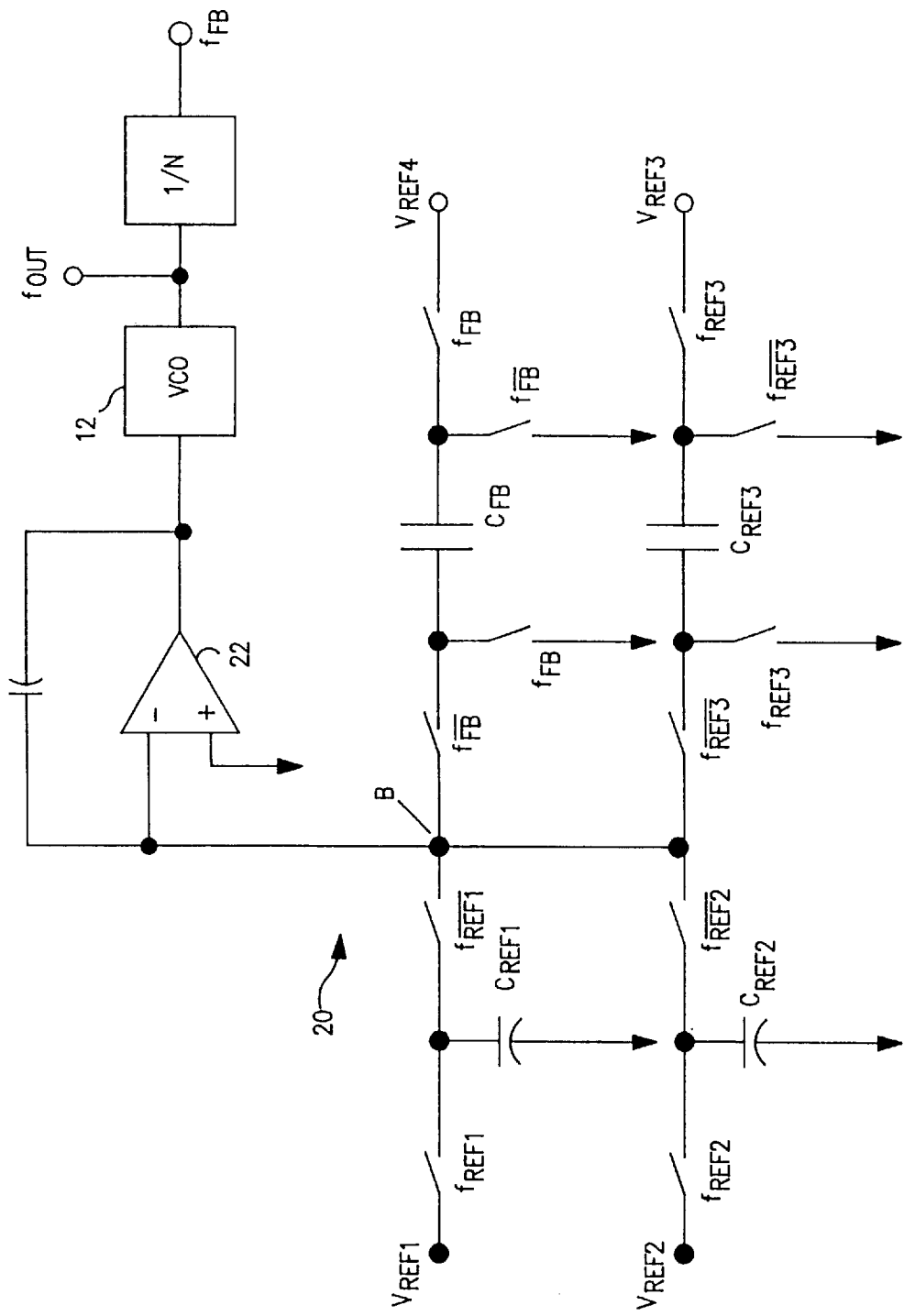
FIG. 2 is a combination block and circuit diagram of a further embodiment of the present invention.

With reference now to FIG. 2, a further embodiment 20 of the present invention may include a switched-capacitor circuit with plural reference capacitors, $C_{REF1,2,3}$ in this embodiment although the invention is not limited to three reference capacitors. As will be apparent, other switched-capacitor circuits may also be used without departing from the scope of the present invention. Operation of the embodiment of FIG. 2 is the same as that of FIG. 1, but with greater flexibility. For example, capacitors $C_{REF1}$ and $C_{REF2}$ are both adding charge to the integrator (a charge integrating amplifier 22 in this embodiment) and capacitors $C_{REF3}$ and $C_{FB}$ are both removing charge from amplifier 22. The three reference capacitors may be clocked at respective reference frequencies $f_{REF1}$, $f_{REF2}$ and $f_{REF3}$ which may be the same or different, and may be charged with respective reference voltages $V_{REF1}$, $V_{REF2}$ and $V_{REF3}$ which may be the same or different.

Under steady state conditions, the feedback of the scaled VCO output $f_{FB}$ to switches 18 which operate switched feedback capacitor $C_{FB}$ forces the DC current entering node B to be zero, thereby setting the equality:

$$f_{REF1} \cdot C_{REF1} \cdot V_{REF1} + f_{REF2} \cdot C_{REF2} \cdot V_{REF2} - f_{REF3} \cdot C_{REF3} \cdot V_{REF3} = f_{OUT} \cdot C_{FB} \cdot V_{REF4}/N \quad (3)$$

which may be rewritten as follows if the reference voltages are equal:

$$f_{OUT} = N \cdot [(f_{REF1} \cdot C_{REF1}) + (f_{REF2} \cdot C_{REF2}) - (f_{REF3} \cdot C_{REF3})]/C_{FB} \quad (4)$$

Thus, oscillator output frequency $f_{OUT}$ may be a function of sums of frequencies, differences in frequencies, ratios of capacitors, the ratio of reference voltages and/or factor N. This simple circuit may be implemented in a single integrated circuit, and may include components whose values can be easily controlled in the manufacturing process. The output frequency may be made dependent only on relative matching of capacitors.

The loop bandwidth of the FLL can be adjusted independently of the oscillator output frequency by scaling all of the $V_{REF}$s by the same factor. The average current injected into the charge integrator by both the reference and feedback capacitors is related to their respective $V_{REF}$s. The loop bandwidth is directly related to how fast the charge integrator can be charged which is determined by the average current injected by each switched capacitor. Therefor a larger $V_{REF}$ will have a higher loop bandwidth than will a smaller $V_{REF}$. Loop bandwidth controls the rate at which the FLL operates, and one $V_{REF}$ may be set to provide a wide bandwidth for fast initial acquisition, and then another $V_{REF}$ may be used to provide a narrow bandwidth to slow down the loop and minimize jitter.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A frequency locked loop (FLL) comprising:
a charge integrating amplifier;
a voltage controlled oscillator which operates in response to an output voltage from said amplifier;
a switched-capacitor circuit for providing an input current to said amplifier which is a function of a combination of a reference current related to a reference frequency and a feedback current related to an output frequency of said voltage controlled oscillator,
whereby the input current varies in response to the output frequency to lock the FLL on a frequency.

2. The FLL of claim 1 wherein said switched-capacitor circuit comprises a reference capacitor for being switched at the reference frequency, a feedback capacitor for being switched at the output frequency, and circuit means for combining charges moved by said reference and feedback capacitors and for providing the combined charges as the input current to said amplifier,
whereby the output frequency is a function of a product of the reference frequency times a ratio of the capacitance of said reference capacitor and the capacitance of said feedback capacitor.

3. The FLL of claim 2 further comprising a first reference voltage for charging said reference capacitor and a second reference voltage for charging said feedback capacitor, wherein a ratio of the first reference voltage to the second reference voltage is one of (a) an inverse of the ratio of the capacitance of said reference capacitor to the capacitance of said feedback capacitor, and (b) one.

4. The FLL of claim 2 further comprising a first reference voltage for charging said reference capacitor and a second reference voltage for charging said feedback capacitor, wherein magnitudes of the first and second reference voltages determine a bandwidth of the FLL.

5. The FLL of claim 4 wherein the output frequency is independent of changes in the bandwidth of the FLL when the magnitudes of the first and second reference voltages are scaled by the same factor.

6. A charge-based frequency locked loop (FLL) comprising an oscillator whose output frequency controls the amount of charge provided by a switched feedback capacitor to a charge integrator whose output voltage controls the frequency of said oscillator.

7. The FLL of claim 6 further comprising a switched reference capacitor for providing a charge to said charge integrator which is a function of a reference frequency, wherein said oscillator output frequency is a function of a product of the reference frequency times a first ratio of the capacitance of said reference capacitor to the capacitance of said feedback capacitor.

8. The FLL of claim 7 further comprising a first reference voltage for charging said reference capacitor and a second reference voltage for charging said feedback capacitor, wherein said oscillator output frequency is further a function of a second ratio of the first reference voltage to the second reference voltage.

9. The FLL of claim 8 wherein a product of the first and second ratios is one.

10. The FLL of claim 8 wherein the second ratio is one.

11. The FLL of claim 6 further comprising plural switched reference capacitors, each for moving a charge responsive to respective reference frequencies, and circuit means for providing a combination of the moved charges and charge provided by said feedback capacitor to said charge integrator.

12. The FLL of claim 11 further comprising a divider for said oscillator output frequency, and wherein said oscillator output frequency is a function of a divisor from said divider and a ratio of (a) a combination of a capacitance of a first said reference capacitor times its respective said reference frequency and a capacitance of a second said reference capacitor times its respective said reference frequency to (b) a capacitance of said switched feedback capacitor.

13. The FLL of claim 12 comprising three said reference capacitors which are arranged so that said combination is a sum of the capacitance of the first said reference capacitor times its respective said reference frequency and the capacitance of the second said reference capacitor times its respective said reference frequency minus a capacitance of a third said reference capacitor times its respective said reference frequency.

14. The FLL of claim 11 wherein said plural switched reference capacitors are arranged so that said oscillator output frequency is a function of a difference between a capacitance of a first said reference capacitor times its respective said reference frequency and a capacitance of a second said reference capacitor times its respective said reference frequency.

15. The FLL of claim 11 wherein said plural switched reference capacitors are arranged so that said oscillator output frequency is a function of a sum of a capacitance of a first said reference capacitor times its respective said reference frequency and a capacitance of a second said reference capacitor times its respective said reference frequency.

16. A method of frequency locking a frequency of an output from an oscillator comprising the steps of using an output frequency from the oscillator to control the amount of charge provided by a switched feedback capacitor to a charge integrator, and using an output voltage of the charge integrator to control the output frequency of the oscillator.

17. The method of claim 16 further comprising the step of providing a charge from a switched reference capacitor to the charge integrator which is a function of a reference frequency, so that the oscillator output frequency is a function of a product of the reference frequency times a first ratio of the capacitance of the reference capacitor to the capacitance of the feedback capacitor.

18. The method of claim 17 further comprising the step of charging the reference capacitor with a first reference voltage and charging the feedback capacitor with a second reference voltage, so that the oscillator output frequency is further a function of a second ratio of the first reference voltage to the second reference voltage.

19. The method of claim 17 further comprising the steps of charging the reference capacitor with a first reference voltage and charging the feedback capacitor with a second reference voltage, and setting a loop bandwidth by adjusting magnitudes of the first and second reference voltages.

20. The method of claim 19 further comprising the step of scaling the magnitudes of the first and second reference voltages by the same factor so that the output frequency is independent of changes in the loop bandwidth.

21. The method of claim 20 further comprising the step of providing the first and second reference voltages so that a product of the first and second ratios is one.

22. The method of claim 20 further comprising the step of providing equal first and second reference voltages.

23. The method of claim 16 further comprising the step of providing charges from plural switched reference capacitors to the charge integrator, the amount of each of the charges being responsive to respective reference frequencies.

24. The method of claim 23 further comprising the step of multiplying the oscillator output frequency by a factor, so that the oscillator output frequency is a function of the factor times a ratio of (a) a combination of a capacitance of a first reference capacitor times its respective reference frequency and a capacitance of a second reference capacitor times its respective reference frequency to (b) a capacitance of the switched feedback capacitor.

25. The method of claim 24 comprising the step of arranging three of the reference capacitors so that the combination is a sum of the capacitance of the first reference capacitor times its respective reference frequency and the capacitance of the second reference capacitor times its respective reference frequency minus a capacitance of a third reference capacitor times its respective reference frequency.

26. A method of setting a bandwidth of a frequency locked loop (FLL) independently of an output frequency of an oscillator in the FLL, the method comprising the steps of:

(a) using an output frequency from the oscillator to control the amount of charge provided by a switched feedback capacitor to a charge integrator;

(b) providing a charge from a switched reference capacitor to the charge integrator which is a function of a reference frequency;

(c) using an output voltage of the charge integrator to control the output frequency of the oscillator;

(d) charging the reference capacitor with a first reference voltage and charging the feedback capacitor with a second reference voltage;

(e) setting a bandwidth of the FLL by adjusting magnitudes of the first and second reference voltages; and (f) scaling the magnitudes of the first and second reference voltages by the same factor so that the output frequency is independent of changes in the loop bandwidth.

* * * * *